(12) United States Patent
Pan et al.

(10) Patent No.: US 12,471,258 B2
(45) Date of Patent: Nov. 11, 2025

(54) POWER SUPPLY WITH COOLING FAN

(71) Applicant: CHANNEL WELL TECHNOLOGY CO., LTD., Taoyuan (TW)

(72) Inventors: Yen-Cheng Pan, Taoyuan (TW); Bo-Lun Lin, Taoyuan (TW); Chia-Ying Lin, Taoyuan (TW)

(73) Assignee: CHANNEL WELL TECHNOLOGY CO., LTD., Taoyuan (TW)

( * ) Notice: Subject to any disclaimer, the term of this patent is extended or adjusted under 35 U.S.C. 154(b) by 190 days.

(21) Appl. No.: 18/395,652

(22) Filed: Dec. 25, 2023

(65) Prior Publication Data
US 2025/0151244 A1 May 8, 2025

(30) Foreign Application Priority Data
Nov. 2, 2023 (TW) .................................. 112142223

(51) Int. Cl.
*H05K 7/20* (2006.01)
(52) U.S. Cl.
CPC ..... *H05K 7/20909* (2013.01); *H05K 7/20172* (2013.01)

(58) Field of Classification Search
CPC .................................................. H05K 7/20172
See application file for complete search history.

(56) References Cited

U.S. PATENT DOCUMENTS

| | | | |
|---|---|---|---|
| 7,715,179 B2 * | 5/2010 | Wang | G06F 1/26 345/157 |
| 11,531,384 B1 * | 12/2022 | Pan | G06F 1/20 |
| 2010/0284149 A1 * | 11/2010 | Su | H05K 7/20909 361/695 |

* cited by examiner

*Primary Examiner* — Mukundbhai G Patel

(57) ABSTRACT

A power supply with a cooling fan includes a first housing, a fan body, a plurality of connecting members, and a second housing. The first housing includes a first bottom wall and two first side walls, and the two first side walls have two first extension parts. Each connecting member includes a strip of connecting part and two fixing parts connected to the connecting part. The fan body is disposed in the first housing, and fixed to the first extension part by each fixing part. The connecting part is supported between the two fixing parts along the side of the fan body. The second housing uses a second bottom wall and two second side walls to cover the first extension parts and the connecting members, and is fixed with the first housing, so that the fixing elements of the fan body are not exposed on the power supply.

6 Claims, 6 Drawing Sheets

POWER SUPPLY WITH COOLING FAN

CROSS-REFERENCE TO RELATED APPLICATION

This non-provisional application claims priority under 35 U.S.C. § 119(a) on Patent Application No(s). 112142223 filed in Taiwan, R.O.C. on Nov. 2, 2023, the entire contents of which are hereby incorporated by reference.

BACKGROUND OF THE INVENTION

1. Field of the Invention

The present disclosure relates to a power supply, and in particular to a power supply with a cooling fan.

2. Description of the Related Art

A power supply, especially a power supply used to power a computer host, can transform and rectify AC power to power a hard disk, an optical drive, and a motherboard in the computer host, and is usually provided with a cooling fan to dissipate heat from the hard disk, the optical drive, and the motherboard. The cooling fan is usually fastened to the housing of the power supply with screws, so that the housing of the power supply is covered with exposed screw heads. In addition to being exposed on the housing of the power supply, the exposed screw heads also affect the flatness of the housing. When the power supply is installed in a card slot of the computer host, interference, friction, and vibration, can be caused, which affects the quality of the installation. Moreover, the exposed screw heads on the housing of the power supply also looks obtrusive, which may lead to reduced desire for a consumers to purchase.

BRIEF SUMMARY OF THE INVENTION

Therefore, in order to solve the problems of the traditional power supply with a cooling fan, the present disclosure provides a power supply with a cooling fan, including fastening elements for fixing the cooling fan in the power supply that can be hidden in a housing without being exposed.

To achieve the above objective and more, the present disclosure provides a power supply with a cooling fan comprising a first housing, a fan body, a plurality of connecting members, and a second housing. The first housing includes a first bottom wall and two first side walls. The two first side walls are parallel to each other, and are respectively connected to two ends of the first bottom wall in a first direction. The two first side walls respectively have two first extension parts extending to each other along the first direction. The fan body is disposed in a space formed by the first housing. The plurality of connecting members is arranged on at least two sides of the fan body. Each connecting member includes a strip of connecting part and two fixing parts connected to two ends of the connecting part. The fan body is fixed to the first extension part by each fixing part with a fixing element, and the connecting part is supported between the two fixing parts along the side of the fan body. The second housing includes a second bottom wall and two second side walls, the two second side walls are parallel to each other, and are respectively connected to two ends of the second bottom wall in a second direction. The first direction and the second direction are orthogonal and are both parallel to the first bottom wall or the second bottom wall. The second housing uses the second bottom wall and the two second side walls to cover the first extension parts and the connecting members outside, and is fixed with the first housing, so that the fixing elements are not exposed.

In an embodiment of the disclosure, each fixing part includes a first locking part and a second locking part, the first locking part is used for locking to the fan body, and the second locking part is used for locking to each first extension part.

In an embodiment of the present disclosure, the first housing is a bottom shell, and the second housing is an upper cover, the second bottom wall has a plurality of heat dissipation holes, and a position of the fan body in the first housing is relatively close to the second bottom wall.

In an embodiment of the present disclosure, the power supply further includes an electrical port, arranged in one of the two first side walls.

In an embodiment of the present disclosure, one of the two first side walls has a plurality of heat dissipation holes, and the other first side wall has a plurality of mounting holes to be penetrated by electrical connectors.

In an embodiment of the present disclosure, the first side wall is provided with a plurality of nut posts, and the nut posts are used to lock a circuit board on the first side wall.

In an embodiment of the present disclosure, each fixing part has an opening, and a position of the opening on the fixing part is different from that of the first locking part and a second locking part.

Accordingly, the power supply with a cooling fan of the present disclosure can use the second housing to cover the plurality of first extension parts and the plurality of connecting members that are assembled, so that the fixing elements used for fixing the fan body are covered and hidden by the second housing and are not exposed, thereby avoiding the occurrence of situations that affect the installation quality such as interference, friction, and vibration because of the exposure of the fixing elements, and the housing appearance of the power supply will not be obtrusive because there are no exposed fixing elements. In addition, each connecting member is formed by the connecting part connected between the two fixing parts thereof, so that the fixing parts therebetween can mutually support through the connecting part, and thus the fan body can be firmly, stably, and evenly assembled, so as to increase the overall structural safety of the power supply.

DETAILED DESCRIPTION OF THE INVENTION

Figure 1:
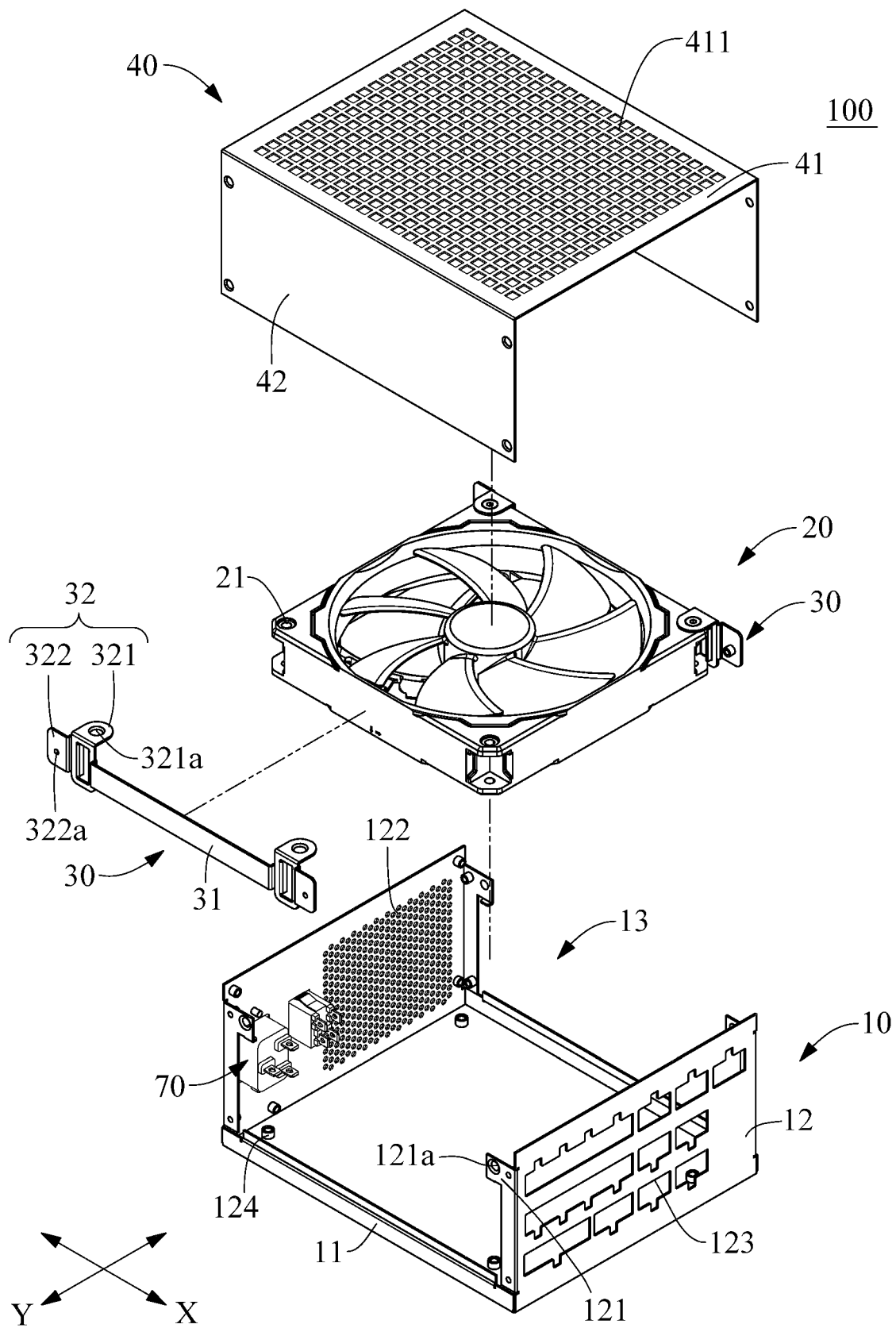
FIG. 1 is a perspective exploded view of a power supply according to an embodiment of the present disclosure.

To facilitate understanding of the present disclosure, the following specific embodiments together with the attached drawings for the detailed description of the present application are provided. One skilled in the art can understand the object, characteristics, and effects of the present disclosure by the content described in the specification. It should be noted that various possible modifications and alterations to the details of the specification could be carried out by implementing or applying other different embodiments based on different views and applications without departing from the spirit of the present application. The related technical contents of the application will be described in detail by the embodiments. However, the disclosed contents should not be considered to limit the scope of the application.

As shown in FIGS. 1 to 5, embodiments of the present disclosure provide a power supply 100 with a cooling fan. The power supply 100 is applied as the power supply of a computer host in a preferred embodiment, but the present disclosure is not limited to this application, and all of the environments in which a power supply is applied in belong to the scope intended to be protected by the present disclosure. The power supply 100 includes a first housing 10, a fan body 20, a plurality of connecting members 30, and a second housing 40 in an embodiment of the present disclosure.

The first housing 10, as shown in FIG. 1, includes a first bottom wall 11 and two first side walls 12. The two first side walls 12 are respectively perpendicular to the first bottom wall 11 and parallel to each other. The two first side walls 12 are connected to two sides of the first bottom wall 11 in a first direction X. The two first side walls 12 respectively have two first extension parts 121 extending to each other along the first direction X, that is, the two first extension parts 121 of any first side wall 12 are extending in a direction of the other first side wall 12.

Figure 3:
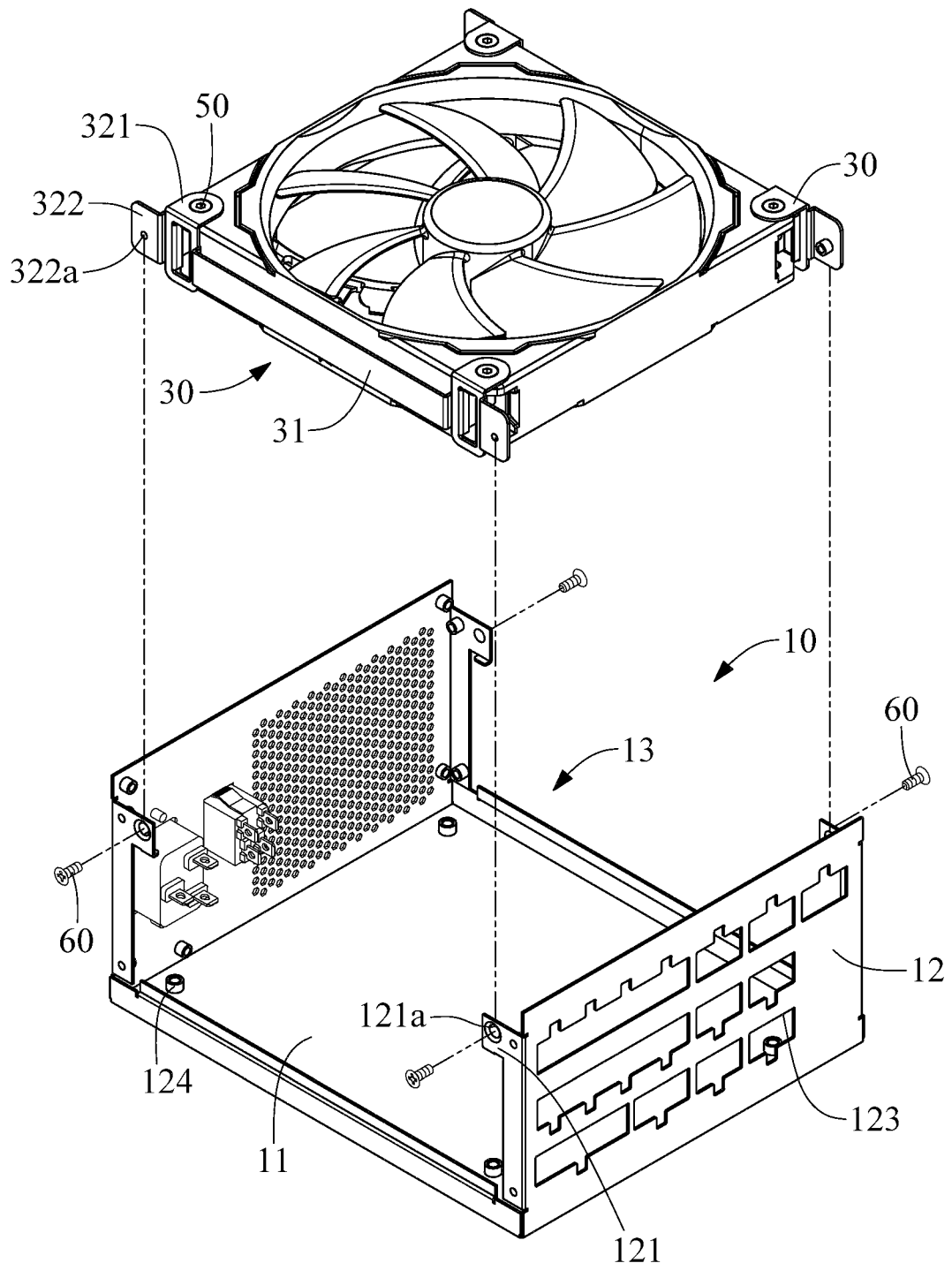
FIG. 3 is a schematic view of connecting members ready to be assembled in a space of a first housing with the fan body according to an embodiment of the present disclosure.
Figure 4:
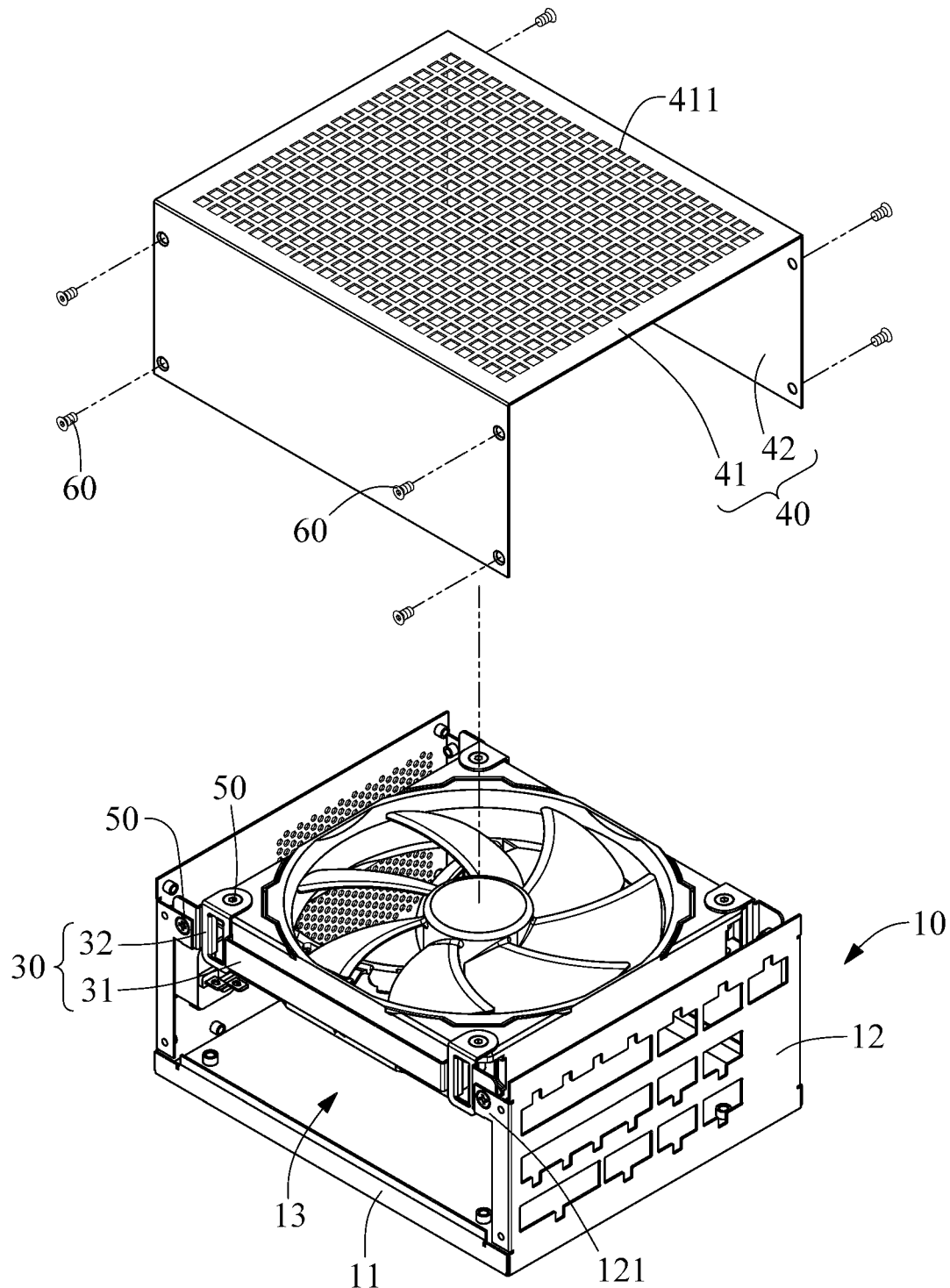
FIG. 4 is a schematic view of the first housing ready to be covered by a second housing according to an embodiment of the present disclosure.

The fan body 20, as shown in FIG. 4, is disposed in a space 13 formed by the first housing 10. In an embodiment there are two connecting members 30 and are respectively arranged on two sides of the fan body 20, but the present disclosure is not limited to two connecting members 30, and in different embodiments, the number of connecting members 30 may be one, or more than two. As shown in FIG. 1, each connecting member 30 includes a connecting part 31 and two fixing parts 32. The connecting part 31 is in the form of a strip, and the two fixing parts 32 are connected to two ends of the connecting part 31. The fan body 20 in the space 13 is fixed to the first extension part 121 at both sides of the first side wall 12 by each fixing part 32 with a fixing element 50 (referring to FIGS. 3, 4 together). The connecting part 31 is supported between the two fixing parts 32 along the side of the fan body 20, so that the fan body 20 is fixed in the first housing 10.

In an embodiment, the fixing element 50 is a screw, and the first extension part 121 has a locking hole 121a. The position and height of the locking hole 121a in the first extension part 121 can be changed accordingly as necessary, so as to change the position of the fan body 20 fixed in the first extension part 121. However, the present disclosure is not limited to the fixing elements 50 as screws, and other elements with fixing functions (such as rivets) also belong to the category of fixing elements described in the present disclosure.

The second housing 40 includes a second bottom wall 41 and two second side walls 42. The two second side walls 42 are respectively perpendicular to the second bottom wall 41 and parallel to each other. The two second side walls 42 are respectively connected to two ends of the second bottom wall 41 in a second direction Y, as shown in FIG. 1, the first direction X and the second direction Y are orthogonal and are both parallel to the first bottom wall 11 and the second bottom wall 41. When the fan body 20 is fixed in the first housing 10 as described above, the second housing 40 uses the second bottom wall 41 and the two second side walls 42 to cover the first extension part 121 and the connecting members 30 outside. The second housing 40 and the first housing 10 are fixed through screws 60. The fan body 20 disposed in the space 13 is covered by the second housing 40 at this time, so that the fan body 20 and the fixing element 50 for fixing the fan body 20 are all hidden in the second housing 40 and are not exposed. In an embodiment, the second bottom wall 41 and the two second side walls 42 of the second housing 40 are a single plate piece, and processed by sheet metal to be a bending form of the second housing 40 shown in FIGS. 1 and 4, but the present disclosure is not limited thereto. The second housing 40 can also be an assembling piece, for example, the second bottom wall 41 and the two second side walls 42 are independent three plate pieces and is formed by combining such as screw locking or welding.

In an embodiment, the number of connecting members 30 is two as shown in FIG. 1, respectively corresponding to the first extension parts 121 located at each side of the two first side walls 12, and are locked on the locking holes 121a of the first extension parts 121 by using the fixing elements 50. The position and height of the locking hole 121a may be changed accordingly as necessary, so as to change the position that the fan body 20 is fixed on the first extension 121.

In an embodiment of the present disclosure, each fixing part 32 includes a first locking part 321 and a second locking part 322. The first locking part 321 is used for locking to the fan body 20, and the second locking part 322 is used for locking to each first extension part 121. In an embodiment of the present disclosure, each fixing part 32 has an opening 323. A position of the opening 323 on the fixing part 32 is different from that of the first locking part 321 and the second locking part 322, and the setting of the opening 323 is capable of saving the material of the connecting member 30.

Figure 2:
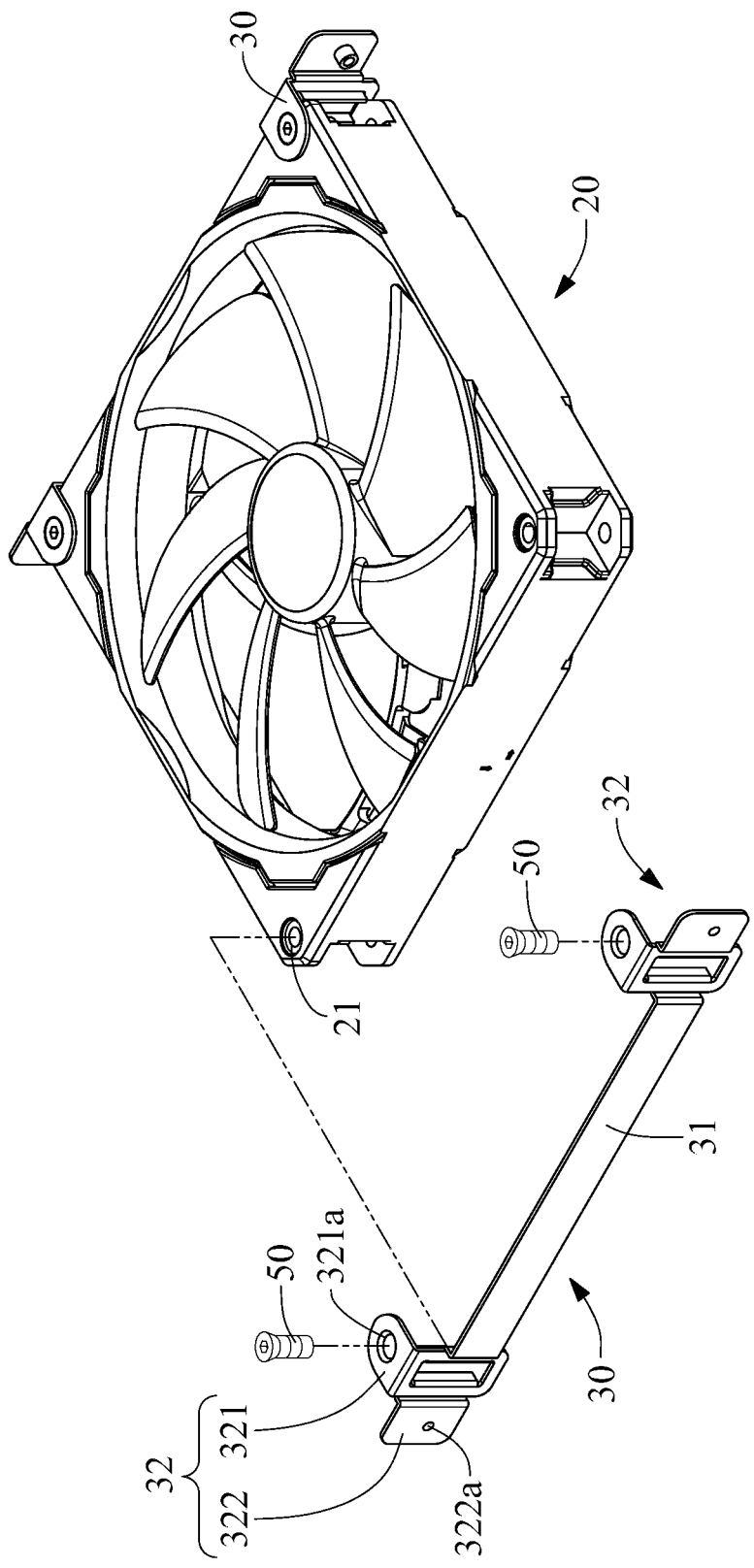
FIG. 2 is a schematic view of connecting members ready to be assembled to a fan body according to an embodiment of the present disclosure.

In detail, as shown in FIG. 1, the fan body 20 is rectangular and has a screw hole 21 at each of the four corners. Referring to FIG. 2 together, the first locking part 321 of the fixing part 32 has a perforation 321a, and the length of the connecting part 31 is suitable for allowing the perforations 321a of the first locking parts 321 at two ends thereof to be aligned with the screw holes 21 of two adjacent corners of the fan body 20 at one time, so that the user can respectively penetrate the two fixing elements 50 through the perforations 321a and lock them in the corresponding screw holes 21.

Furthermore, as shown in FIGS. 2 and 3, the second locking part 322 has a screw hole 322a, and when the connecting member 30 is locked to the fan body 20 with the first locking part 321 as described above. The fan body 20 is moved into the space 13, the screw hole 322a of the second locking part 322 can be aligned with the locking hole 121a of the first extension part 121, so that the user can respectively penetrate the two fixing elements 50 through the locking hole 121a and lock it in the corresponding screw hole 322a.

In an embodiment of the present disclosure, the first housing 10 is a bottom shell, and the second housing 40 is an upper cover. Furthermore, the second bottom wall 41 has a plurality of heat dissipation holes 411, and a position of the fan body 20 in the first housing 10 is relatively close to the second bottom wall 41, that is, the fan body 20 is set close to the heat dissipation holes 411. Referring to FIG. 4 together, when the fan body 20 is actuated, the air flow can be directly directed to the heat dissipation holes 411, and thus the air flow can quickly circulate to the outside and dissipate heat.

In an embodiment of the present disclosure, the power supply further includes an electrical port 70. The electrical port 70 is arranged in one of the two first side walls 12. The electrical port 70, for example, is a socket or switch, which is used to connect an external power source (such as utility power) to be used as a power source of the power supply 100.

In an embodiment of the present disclosure, one of the two first side walls 12 has a plurality of heat dissipation holes 122, so that the air in the space 13 can circulate smoothly to the outside in conjunction with the heat dissipation holes 411 of the second bottom wall 41. Furthermore, the other first side wall 12 has a plurality of mounting holes 123, and the mounting holes 123 can be penetrated by electrical connectors (not shown in the figure). In an embodiment of the present disclosure, the first side wall 12 is provided with a plurality of nut posts 124, and the nut posts 124 are used to lock a circuit board (not shown in the figure) on the first side wall 12.

When assembling the power supply 100 of the above embodiments, as shown in FIG. 2, the user can lean the connecting member 30 against one side of the fan body 20, so that the user can hold the connecting part 31 and make the perforations 321a of the first locking parts 321 at both ends be respectively aligned with the screw holes 21 at the two corners of the fan body 20, and the two fixing elements 50 respectively pass through the perforations 321a and lock on the screw holes 21. Thus, the action only needs to be executed twice, and the four fixing parts 32 of the two connecting members 30 can be fixed at the four corners of the fan body 20.

Figure 5:
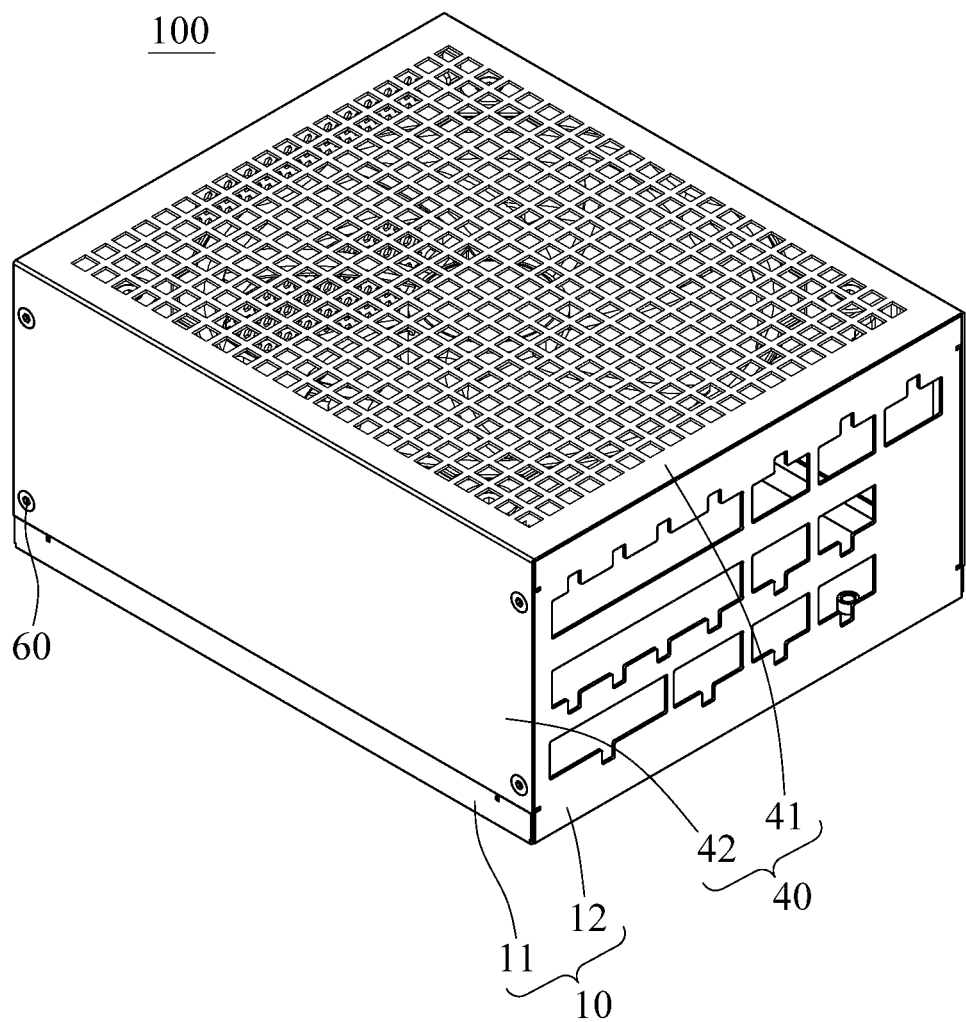
FIG. 5 is a perspective view of the completed assembly of the power supply from a viewing angle according to an embodiment of the present disclosure.
Figure 6:
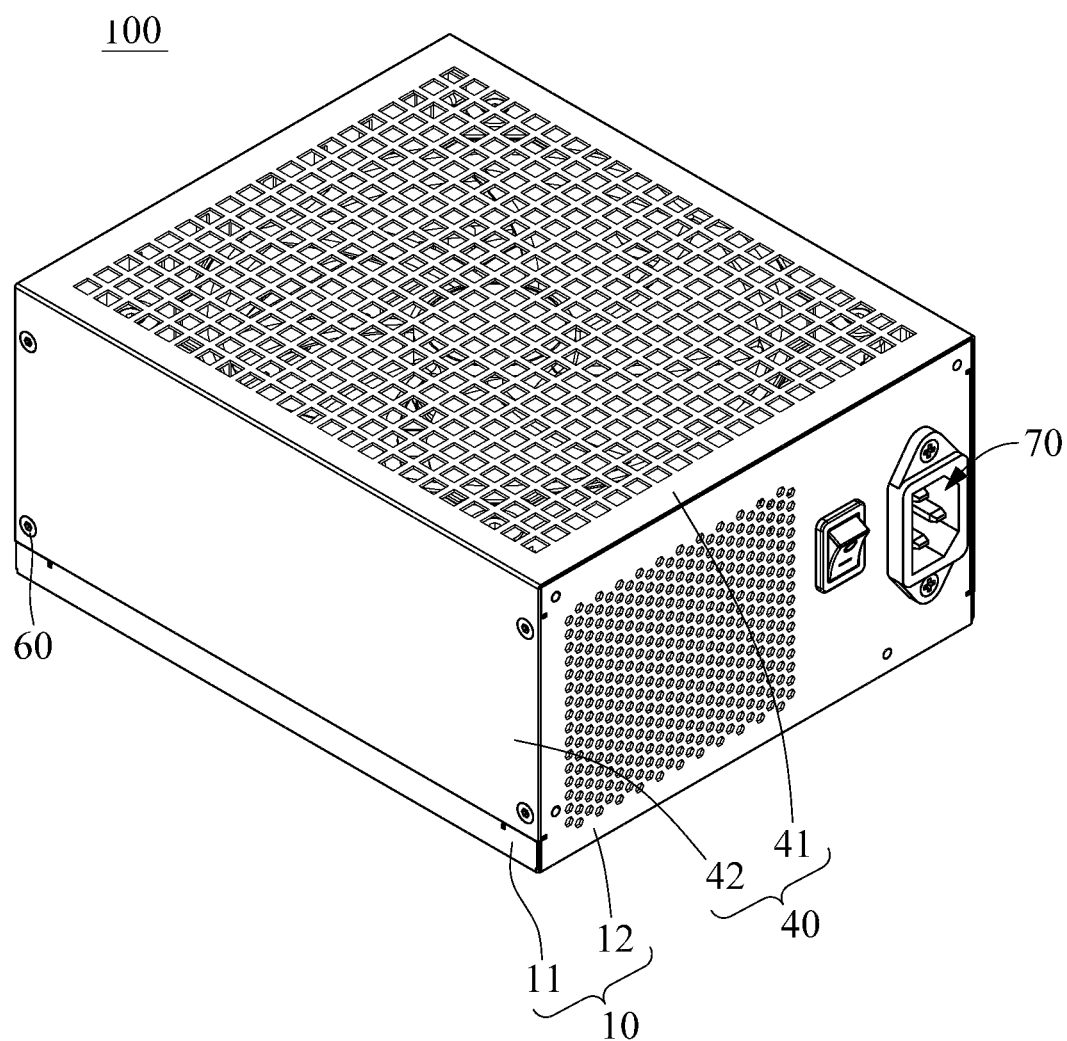
FIG. 6 is a perspective view of the completed assembly of the power supply from another viewing angle according to an embodiment of the present disclosure.

Continuously, as shown in FIGS. 3 and 4, when the connecting member 30 completes assembly in the fan body 20, the user further places the connecting member 30 into the space 13 with the fan body 20, and makes the screw hole 322a of the second locking part 322 align with the locking hole 121a of the first extension part 121. The user can respectively penetrate the four fixing elements 50 through each locking hole 121a and lock it in the corresponding screw hole 322a to complete the assembly of the fan body 20 in the first housing 10. Next, the user can cover the first housing 10 with the second housing 40, and the connecting member 30 and the first extension part 121 that are locked by the fixing elements 50 are covered by the second bottom wall 41 and the two second side walls 42 of the second housing 40. As shown in FIGS. 5 and 6, the fixing elements 50 and the connecting member 30 and the first extension part 121 locked thereby are hidden in the second housing 40 and are not exposed at this time.

From the above description, it is not difficult to find that the advantage of the present disclosure is that the power supply 100 with the cooling fan of the present disclosure can use the second housing 40 to cover the plurality of first extension parts 121 and the plurality of connecting members 30 that are assembled. In this way the fixing elements 50 used for fixing the fan body 20 can be hidden by the second housing 40 and are not exposed, thereby avoiding the occurrence of situations that affect the installation quality such as interference, friction, and vibration with other elements because of the exposure of the fixing elements 50, and the appearance of the power supply 100 will not be obtrusive because there are no exposed fixing elements 50.

Furthermore, each connecting member 30 of the present disclosure is formed by the connecting part 31 connected between the two fixing parts 32 thereof. When the fixing part 32 is fixed between the fan body 20 and the first extension part 121, the two fixing parts 32 of the connecting member 30 can produce the effect of mutual support in the structure through the connecting part 31, so that the assembly of the fan body 20 on the power supply 100 can have a firm and stable effect. The two fixing parts 32 also help the balance of the fan body 20 assembled on the power supply 100 because of the holding of the connecting part 31, that is, the two fixing parts 32 are supported by the connecting part 31, so as to achieve the effect of increasing the overall structural safety of the power supply 100.

While the present invention has been described by means of embodiments, those skilled in the art should understand the above embodiments are merely used to describe the present invention, and it should not be considered to limit the scope of the invention. It should be noted that all changes and substitutions which come within the meaning and range of equivalency of the embodiments are intended to be embraced in the scope of the invention. Therefore, the scope of the invention is defined by the claims.

What is claimed is:

1. A power supply with a cooling fan, comprising:
a first housing, comprising a first bottom wall and two first side walls, the two first side walls are parallel to each other, and are respectively connected to two ends of the first bottom wall in a first direction, and the two first side walls respectively have two first extension parts extending to each other along the first direction;
a fan body, disposed in a space formed by the first housing;
more than two connecting members, arranged on at least two sides of the fan body, each connecting member comprises a strip of connecting part and two fixing parts connected to two ends of the connecting part, the fan body is fixed to the first extension part by each fixing part with a fixing element, and the connecting part is supported between the two fixing parts along the side of the fan body; and
a second housing, comprising a second bottom wall and two second side walls, the two second side walls are parallel to each other, and are respectively connected to two ends of the second bottom wall in a second direction, the first direction and the second direction are orthogonal and are both parallel to the first bottom wall or the second bottom wall, the second housing uses the second bottom wall and the two second side walls to cover the first extension parts and the connecting members outside, and is fixed with the first housing, so that the fixing element is not exposed,
wherein each fixing part comprises a first locking part and a second locking part, the first locking part is used for locking to the fan body, and the second locking part is used for locking to each first extension part.

2. The power supply with a cooling fan according to claim 1, wherein the first housing is a bottom shell, and the second housing is an upper cover, the second bottom wall has a plurality of heat dissipation holes, and a position of the fan body in the first housing is close to the second bottom wall.

3. The power supply with a cooling fan according to claim 2, further comprising an electrical port, arranged in one of the two first side walls.

4. The power supply with a cooling fan according to claim 2, wherein one of the two first side walls has a plurality of heat dissipation holes, and the other first side wall has a plurality of mounting holes to be penetrated by electrical connectors.

5. The power supply with a cooling fan according to claim 2, wherein the first side wall is provided with a plurality of nut posts, and the nut posts are used to lock a circuit board on the first side wall.

6. The power supply with a cooling fan according to claim 1, wherein each fixing part has an opening, and a position of the opening on the fixing part is different from that of the first locking part and the second locking part.

* * * * *